United States Patent [19]

Tsumura

[11] Patent Number: 5,293,066
[45] Date of Patent: Mar. 8, 1994

[54] SEMICONDUCTOR DEVICE MOUNTING STRUCTURE INCLUDING LEAD FRAME AND LEAD PLATE

[75] Inventor: Kiyoaki Tsumura, Itami, Japan

[73] Assignee: Mitsubishi Denki Kabushiki Kaisha, Tokyo, Japan

[21] Appl. No.: 846,906

[22] Filed: Mar. 6, 1992

[30] Foreign Application Priority Data

Mar. 8, 1991 [JP] Japan ............................... 3-043254

[51] Int. Cl.$^5$ ................... H01L 23/48; H01L 29/44; H01L 29/82; H01L 29/60
[52] U.S. Cl. ................................. 257/668; 257/666; 257/672
[58] Field of Search ............... 357/70, 80; 257/666, 257/668, 672, 676

[56] References Cited

U.S. PATENT DOCUMENTS

| | | | |
|---|---|---|---|
| 5,057,805 | 10/1991 | Kadowaki | 357/70 |
| 5,105,257 | 4/1992 | Michii | 357/70 |
| 5,138,430 | 8/1992 | Gow, III et al. | 357/70 |
| 5,151,771 | 9/1992 | Hiroi et al. | 357/70 |

FOREIGN PATENT DOCUMENTS 2-109344 4/1990 Japan .

OTHER PUBLICATIONS

"Breaking Common Sense on Multi-Layer Lead Frames in Plastic Packages", Jun. 1989, pp. 102-109.
"Both An Increase in Power Consumption and Increase in Pins in Resin Encapsulated QFR up to 4W", Sep. 1989, pp. 90-99.
"LSI Makers for the First Time Mount Substrates on Lead Frames", Dec. 1989, pp. 40-49.

Primary Examiner—Sheila V. Clark
Attorney, Agent, or Firm—Leydig, Voit & Mayer

[57] ABSTRACT

Leads near a die pad of a lead frame for a semiconductor device include terminal leads in a pattern on an insulating resin layer. The inner ends of the terminal leads are connected with gold wires to electrode pads of a semiconductor chip, and the outer ends of the terminal leads are also connected with gold wires to inner lead portions of the leads. Wide ground pads are provided which extend from the inner lead portions to the die pad. Ground electrodes on the semiconductor chip are connected with wires to the ground pads to which the insulating resin layer is bonded.

15 Claims, 12 Drawing Sheets

SEMICONDUCTOR DEVICE MOUNTING STRUCTURE INCLUDING LEAD FRAME AND LEAD PLATE

BACKGROUND OF THE INVENTION

1. Field of the Invention

The present invention relates to a lead frame in which more leads are provided in order to increase the number of pins and in which electrical properties and heat radiation are improved, and to a semiconductor device using such a lead frame.

2. Description of the Related Art

Figure 21:
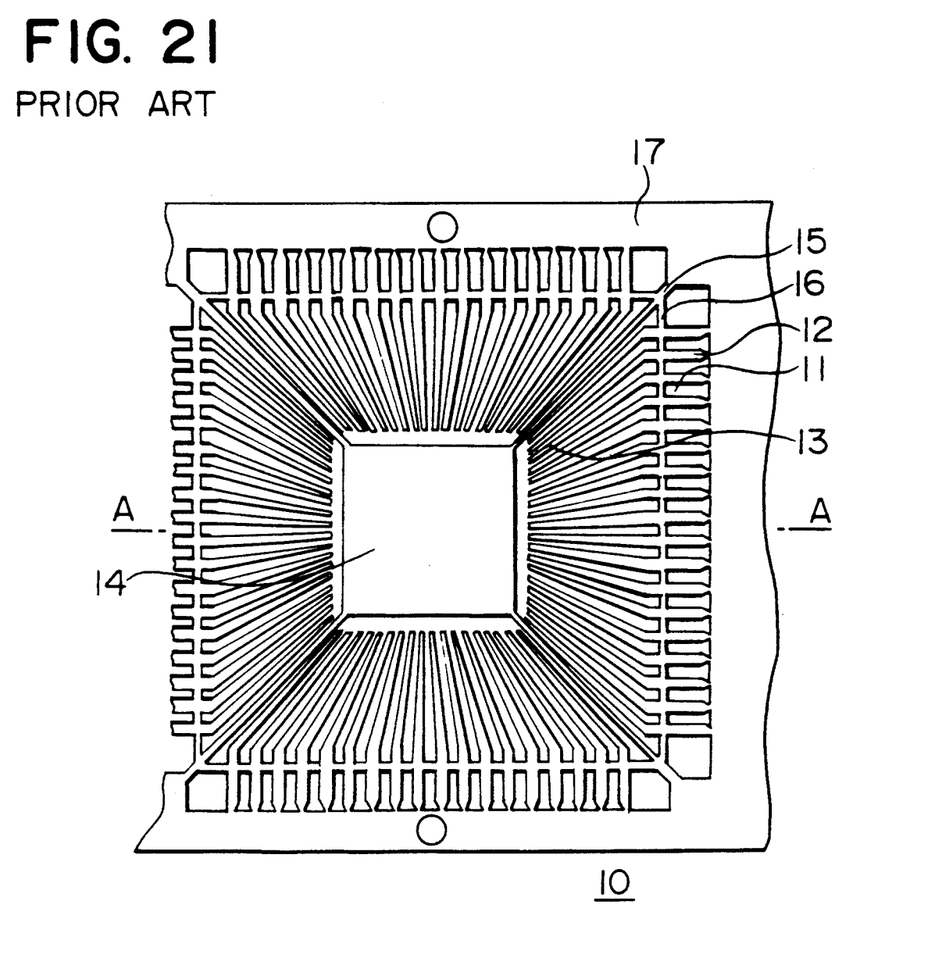
FIG. 21 is a plan view of the conventional lead frame.
Figure 22:
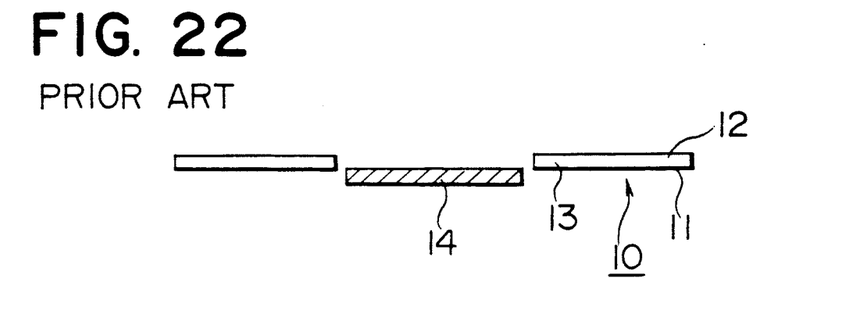
FIG. 22 is a cross-sectional view taken along line A—A of FIG. 21.

FIG. 21 is a plan view of a conventional lead frame, and FIG. 22 is a cross-sectional view taken along line A—A of FIG. 21. In these drawings, numeral 10 denotes a lead frame, and numeral 11 denotes leads each having an outer lead portion 12 and an inner lead portion 13. Numeral 14 denotes a die pad, and number 15 denotes suspending leads suspending the die pad 14 from its four corners. Numeral 16 denotes tie bars connecting the respective leads 11 to the suspending leads 15 so as not to loosen the leads 11. In a frame 17, the tie bars 16 are cut during a manufacturing process for semiconductor devices in order to separate the respective leads 11 from each other. The above components are all supported by the frame 17 which extends outwardly from these components, being formed into the lead frame 10. Typically, a plate is punched by a die, or is chemically etched to form the frame 17 as shown in FIG. 21. In most cases, the surfaces of the die pad 14 and the inner lead portions 13 are plated with silver (Ag), gold (Au), or copper (Cu). The die pad 14 is then pressed downward as shown in FIG. 22.

The structures of the tie bars 16 and the frame 17 are not particularly important in the present invention, so that explanations and drawings of these structures will be omitted hereinafter.

Figure 23:
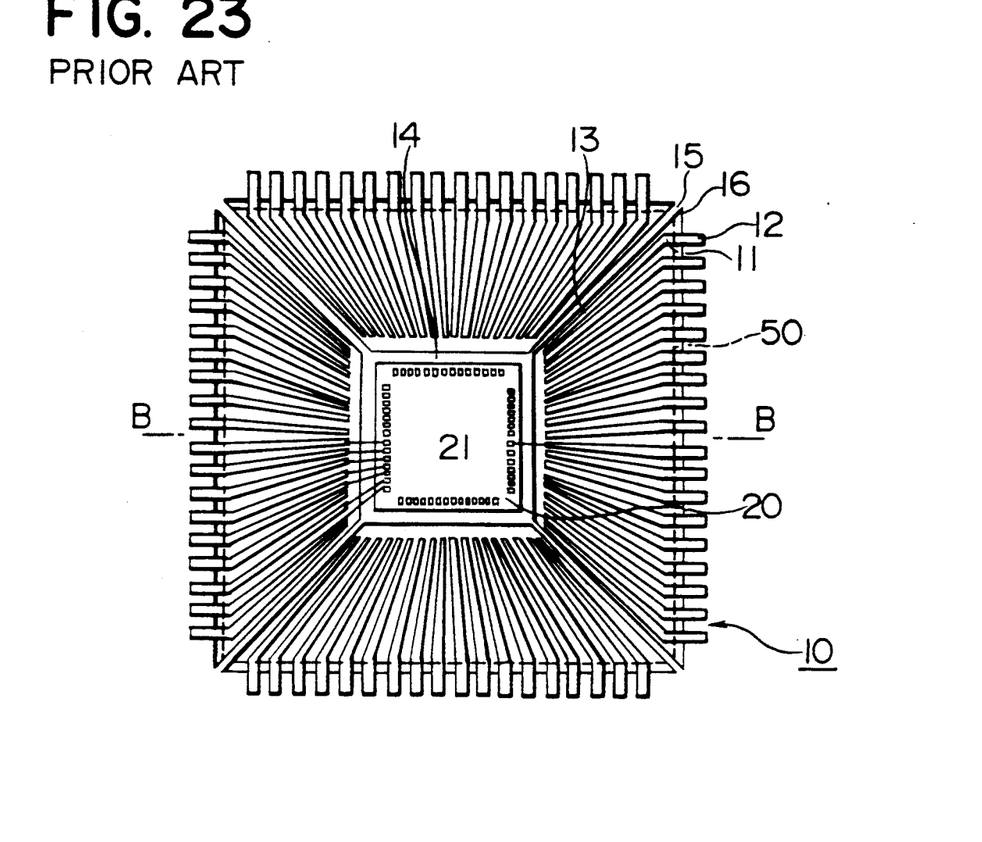
FIG. 23 is a plan view showing the inner structure of the conventional semiconductor device which employs the lead frame in FIG. 21.
Figure 24:
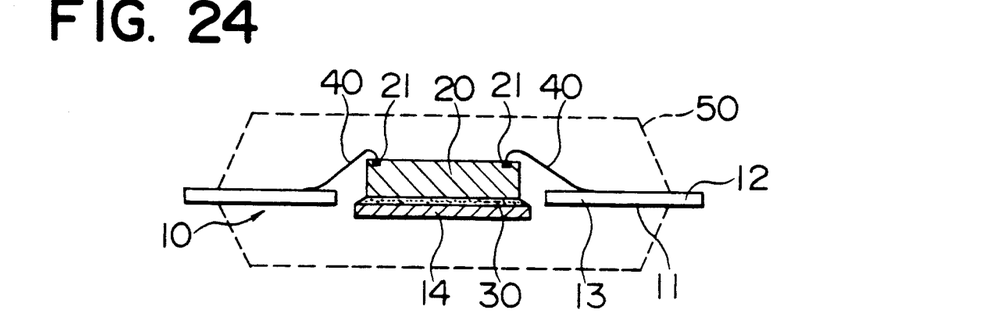
FIG. 24 is a cross-sectional view taken along line B—B of FIG. 23.

FIG. 23 is a plan view showing the inner structure of a conventional semiconductor device which employs the lead frame 10 in FIG. 21, and FIG. 24 is a cross-sectional view taken along line B-B of FIG. 23. Numeral 20 denotes a semiconductor chip; numeral 21 denotes a large number of electrode pads made of aluminum which are arranged on a surface of the semiconductor chip 20; numeral 30 denotes a die bonding material; and numeral 40 denotes fine metal wires (Au wires). A resin-mold portion 50 resin-molding the semiconductor device is indicated by broken lines.

A manufacturing method for such a semiconductor device will now be described. First, the semiconductor chip 20 is placed on the die pad 14 with the die bonding material 30. A material whose main constituent is solder or an electrically-conductive resin is generally used as the die bonding material 30. Next, heat energy is applied to the top of each Au wire 40 having a diameter of about 30 μm so as to form a metal ball (not shown). The metal ball is pressed against each electrode pad 21 on the heated semiconductor chip 20, while at the same time ultrasonic oscillation is provided. Thus, an intermetalic compound is produced between the metal ball and each electrode pad 21 to join them together. The Au wire 40 is then drawn out and pressed against each inner lead portion 13, while at the same time ultrasonic oscillation is provided. Thus, an intermetalic compound is also produced between the Au wire 40 and each inner lead portion 13 to join them together. The method explained above is referred to as an ultrasonic-thermocompression bonding method. The thus-formed leads 11 close to the inner lead portions 13 of lead frame 10 and semiconductor chip 20 are all resin-molded as shown by the resin-molding portion 50. The semiconductor device is thus manufactured.

At this stage, when the Au wire 40 is 30 μm in diameter and over 3.0 mm in length for example, the wire looping shape is not stable because it is easy for wire bending and hanging to occur.

Since the conventional semiconductor device is constructed as above, as the number of pins on the semiconductor chip increases, and as the chip design rule is lowered from a standard for 1.3 μm (for one mega byte DRAMs) to a standard for 1.0 μm (for four mega byte DRAMs), and further to a standard for 0.8 μm (for 16 mega byte DRAMs), shrunken electrode pads accordingly are arranged on a smaller semiconductor chip. As a result, the width of the inner lead portions approaches their process limit. For this reason, it becomes impossible to extend the inner lead portions to near the electrode pads. Consequently, the Au wire looping, connecting the inner lead portions to the electrode pads, must be extended far in excess of its optimum length. This causes poor quality of the wire looping, such as bending and hanging, with the result that semiconductor devices cannot be mass-produced stably.

SUMMARY OF THE INVENTION

Accordingly, to solve the above problems, an object of the invention is production of a lead frame which is capable of increasing the number of leads (pins) while the optimum length of wires is maintained.

Another object of the invention is production of a lowinductance lead frame in which heat radiation and signal transmitting delay are improved and in which heat generated by a semiconductor chip can be spread efficiently.

A further object of the invention is to manufacture a semiconductor device employing the lead frame in accordance with the invention.

In view of the above objects, a lead frame comprises a die pad, a large number of leads arranged radially around the die pad at a predetermined distance, a main lead frame with which a frame extending outwardly so as to support outsides of the great number of leads is integrally formed, a large number of terminal leads (metal wiring) formed on an insulating resin layer extending radially from the side of the die pad of the main lead frame toward the leads, and a terminal lead plate bonded to inside ends of the leads of the main lead frame.

A lead frame including a ground pad is provided in which an inner lead portion of a ground lead is formed on the main lead frame of the lead frame described above and extends toward the die pad, the terminal lead plate being joined to the ground pad.

Semiconductor devices include a semiconductor element mounted on the die pad of the lead frames described above with wire bonding between the electrode pads arranged on the semiconductor chip and the inner ends of the terminal leads on the terminal lead plates, between ground electrodes and the ground pads, and between the outer ends of the terminal leads and the inner lead portions of the leads of the main frame, all being resin-molded.

In the present invention, the terminal leads, formed on the insulating resin layer of the terminal lead plate, are patterned by etching copper foils which are thinner than the standard lead frame. It is thus possible to form a circuitry pattern finer than the lead frame, and to increase the number of pins beyond the present process limit of the lead frame. That is, the structure combines a tape automated bonding tape (hereinafter referred to as a TAB tape) with a lead frame. Furthermore, by altering the length of the terminal leads, the wire length can be appropriately selected between the terminal leads and the electrode pads and between the terminal leads and the inner lead portions.

Moreover, because the material of the main lead frame is made of copper alloy, and because ground pads are provided which have wide areas and which extend in such a manner as to form a plane toward the inner lead portions of the ground leads, these ground pads having wide areas have high heat radiation and reduced inductance.

DESCRIPTION OF THE PREFERRED EMBODIMENTS

The embodiments of the present invention will be described below.

Figure 5:
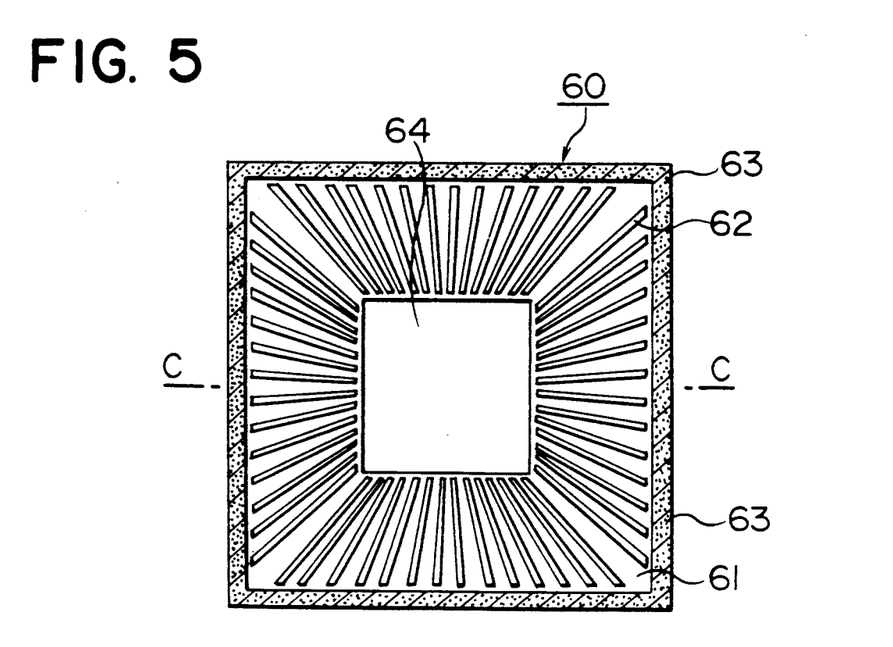
FIG. 5 is a plan view showing an embodiment of a terminal lead plate which constitutes a lead frame in accordance with an embodiment of the invention.
Figure 6:
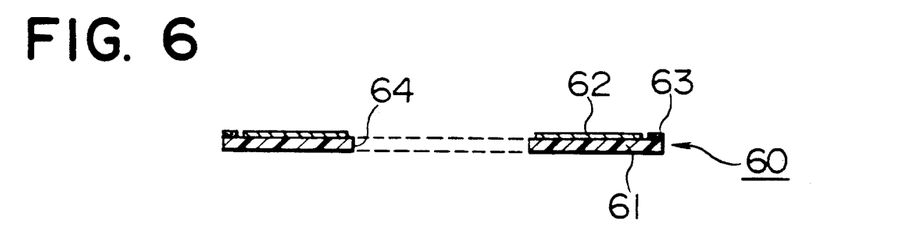
FIG. 6 is a cross-sectional view taken along line C—C of FIG. 5.

FIG. 5 is a plan view showing a terminal lead plate 60 used for a lead frame in accordance with an embodiment of a first invention, and FIG. 6 is a cross-sectional view taken along line C—C of FIG. 5. Numeral 61 denotes an insulating resin layer; numeral 62 denotes terminal leads (copper foils) formed on the insulating resin layer 61; and numeral 63 denotes a thermosetting adhesive layer formed at the edges of the insulating resin layer 61. Numeral 64 denotes a penetrating hole formed at the center of the insulating resin layer 61. A die pad, which will be described below, is pressed and fitted into the penetrating hole 64. The insulating resin layer 61 is made of glass epoxy resin or polyimide (a heat resistant macromolecular material). Copper foils are bonded, for example, to the terminal leads 62 so as to form patterns. The surfaces of the pattern-formed terminal leads 62 are then plated with silver (Ag), gold (Au), or copper (Cu).

Figure 7:
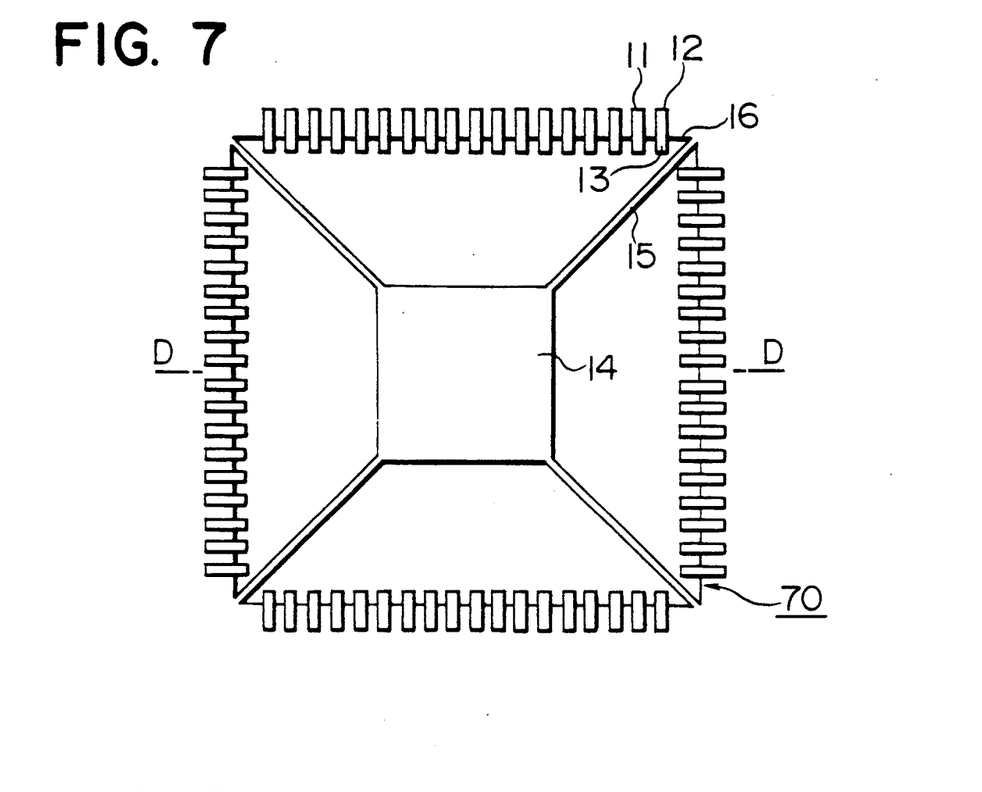
FIG. 7 is a plan view showing an embodiment of a main lead frame which constitutes a lead frame in accordance with the invention.
Figure 8:
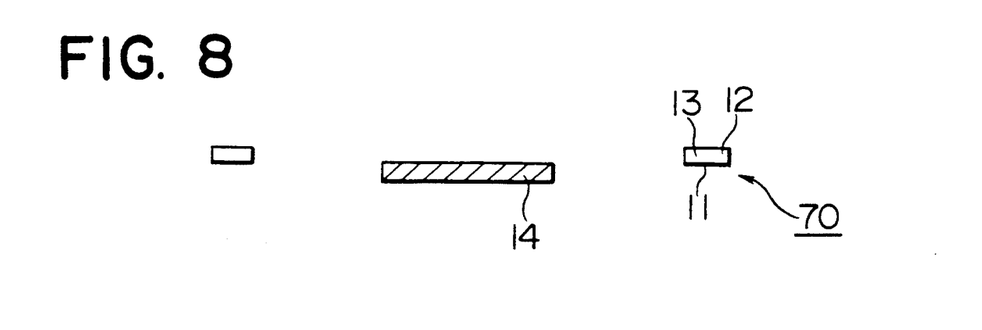
FIG. 8 is a cross-sectional view taken along line D—D of FIG. 7.

FIG. 7 is a plan view showing a main lead frame 70 used for the lead frame in accordance with the embodiment of the first invention, and FIG. 8 is a cross-sectional view taken along line D—D of FIG. 7. Numeral 11 denotes leads each having an outer lead portion 12 and an inner lead portion 13; numeral 14 denotes the die pad; numeral 15 denotes suspending leads for suspending the die pad 14 from its four corners; and numeral 16 denotes tie bars for connecting the respective leads 11 in line so as not to loosen them. Though not shown, a frame (see numeral 17 in FIG. 21) extends outwardly from these tie bars to support them. In the same way as in the conventional art, typically, a plate is punched by a die, or is chemically etched to form the main lead frame 70 as shown in FIG. 7. The leads 11 are shorter than the conventional leads shown in FIGS. 21-24, and are not necessarily made into tapered shapes. Even if the leads are increased further in number, current process technology is sufficient to manufacture them. The surfaces of the inner lead portions 13 and the die pad 14 are plated with silver (Ag), gold (Au), or copper (Cu). The die pad 14 is then pressed downward as shown in FIG. 8.

Figure 9:
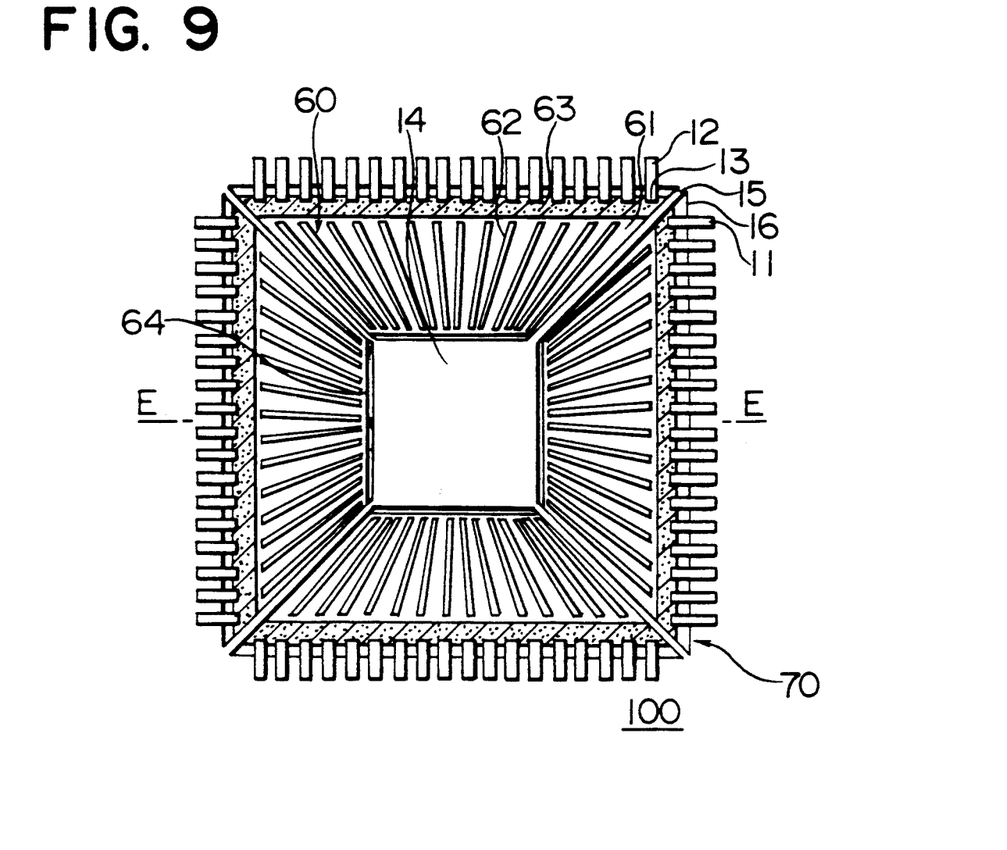
FIG. 9 is a plan view of a lead frame in accordance with an embodiment of the invention which constitutes the terminal lead plate in FIG. 5 and the main lead frame in FIG. 7.
Figure 10:
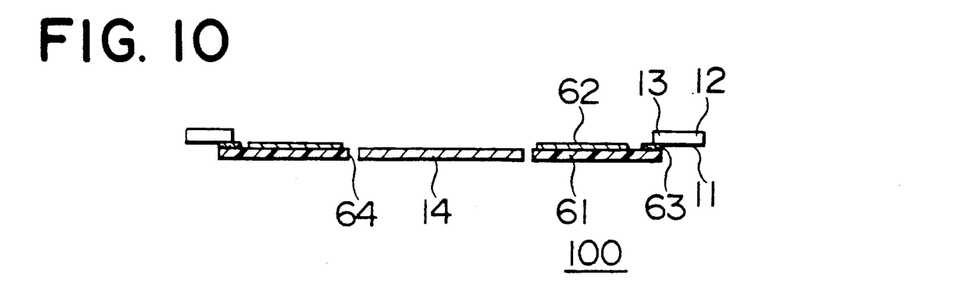
FIG. 10 is a cross-sectional view taken along line E—E of FIG. 9.

FIG. 9 is a plan view of a lead frame 100 in accordance with the embodiment of the invention. The terminal lead plate 60 in FIG. 5 and the main lead frame 70 in FIG. 7 are bonded together to form the lead frame 100. FIG. 10 is a cross-sectional view taken along line E—E of FIG. 9. Reverse sides of the inner lead portions 13 (of the leads 11), constituting the main frame 70, are pressed against the adhesive layer 63 formed at the edges of a surface of the terminal lead plate 60. The adhesive layer 63 is then thermoset to form the lead frame 100.

Figure 1:
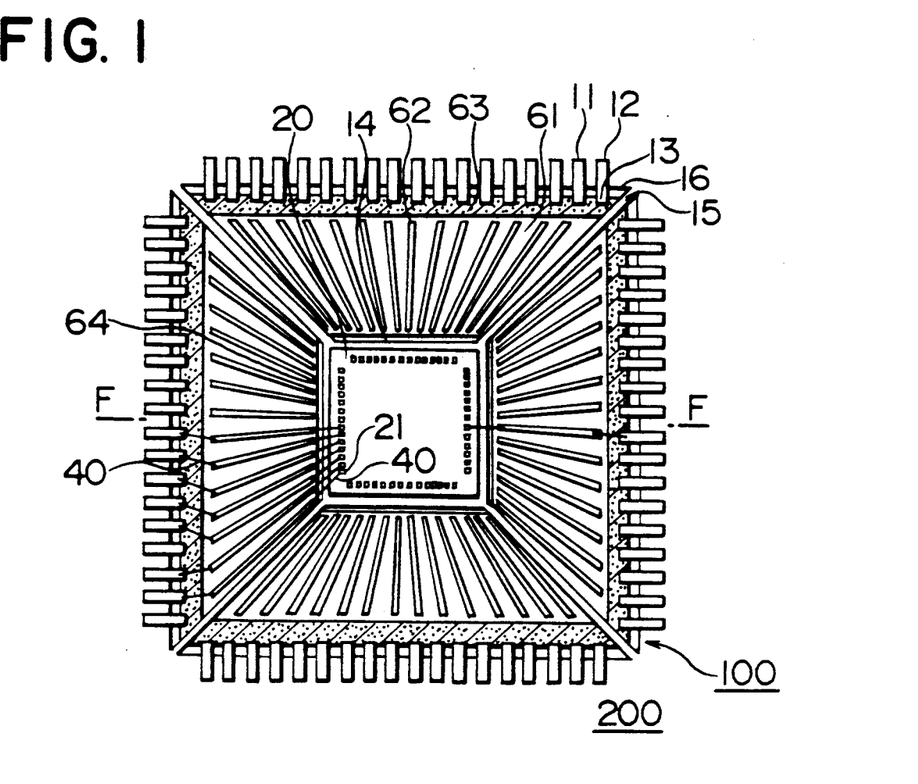
FIG. 1 is a plan view showing the inner structure of a semiconductor device in accordance with an embodiment of the invention.
Figure 2:
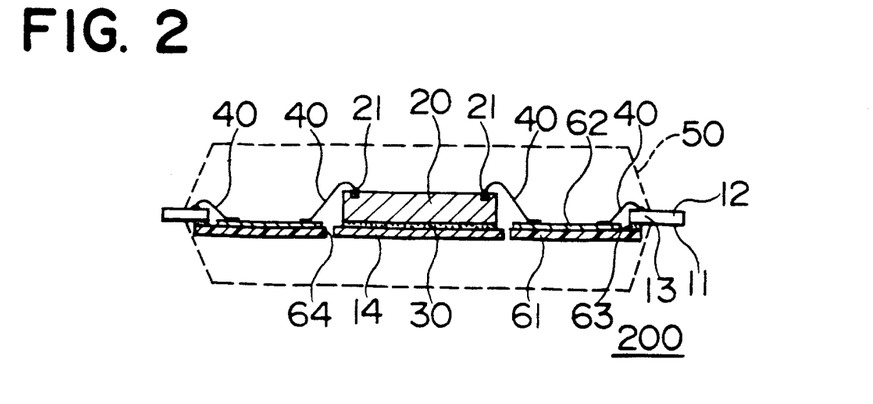
FIG. 2 is a cross-sectional view taken along line F—F of FIG. 1.

FIG. 1 is a plan view showing the inner structure of a semiconductor device, in accordance with an embodiment of the invention, which uses the lead frame 100 of FIGS. 9 and 10. FIG. 2 is a cross-sectional view taken along line F—F of FIG. 1. Numeral 20 denotes a semiconductor chip, and numeral 21 denotes a large number of electrode pads arranged on an obverse surface of the semiconductor chip 20. Numeral 30 denotes a die bonding material; numeral 40 denotes fine metal wires or Au wires; and numeral 50 denotes a resin-molding portion. The semiconductor chip 20 is mounted on the die pad 14 by means of the die bonding material 30 whose principal constituent is solder or an electrically-conductive resin. Wire bonding is performed thereafter, which is a method where the electrode pads 21 on the semiconductor chip 20 are electrically connected with the Au wires to inner ends of the respective terminal leads 62. The same wire bonding method as the conventional one is employed, that is, the end of each Au wire 40 is flamed to form a ball (not shown), and this ball is bonded to each electrode pad 21 by an ultrasonic-thermo-compression bonding method. Each Au wire 40 is then drawn out and bonded to the inner end of each terminal lead 62, and is then cut. This bonding is also performed by the ultrasonic-thermo-compression bonding method. The above steps are repeated for the remaining terminal leads 62. In the same steps as above, the wire bonding method is performed to bond the outer end of each terminal lead 62 to the inner lead portion 13 of each lead 11 (of the lead frame 100). Thereafter, the leads 11 near the inner lead portions 13 are all resin-molded as shown by a resin-molding portion 50 indicated by broken lines in FIG. 2. The outer end of the outer lead portion 12 of each lead 11 and the outer end of each suspending lead 15 are cut to separate these ends from a frame (see numeral 17 in FIG. 21). The tie bars 16 bonding the leads 11 together are then cut so as to separate the leads 11 from each other. Finally, a lead process such as plating is carried out for the outer lead portions 12, thus forming a semiconductor device 200.

Figure 3:
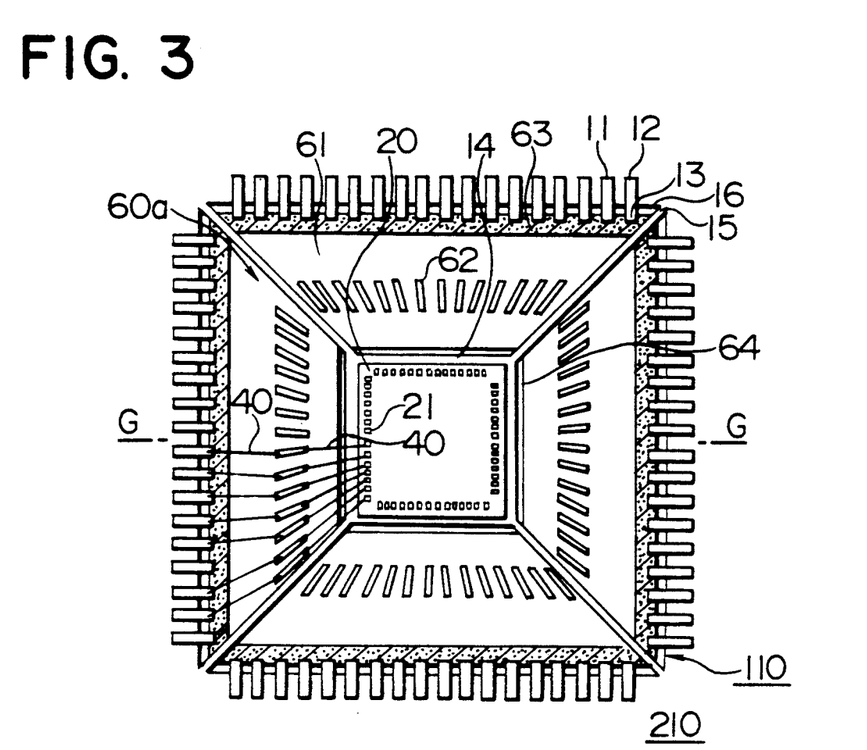
FIG. 3 is a plan view showing the inner structure of the semiconductor device in accordance with an embodiment of the invention.
Figure 4:
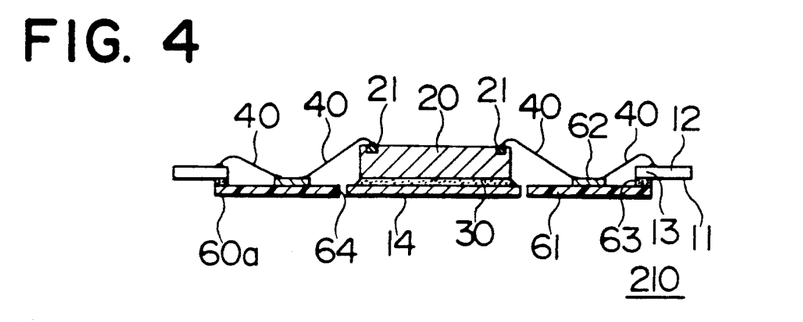
FIG. 4 is a cross-sectional view taken along line G—G of FIG. 3.

In the semiconductor device 200 of FIG. 1, though each terminal lead 62, formed on the insulating resin layer 61, extends from the innermost part of the terminal lead plate 60, (adjacent to the die pad 14) to the outermost part of the same (at the inner lead portions 13), it is not necessary to form the leads in this manner. For example, each terminal lead 62 may be formed in any space of the terminal lead plate 60 between the die pad 14 and the adhesive layer 63. FIG. 3 is a plan view showing the inner structure of a semiconductor device in accordance with embodiments of the invention. FIG. 4 is a cross-sectional view, with a resin-molding portion omitted, taken along line G—G of FIG. 3. In a semiconductor device 210 shown in these drawings, each terminal lead 62 formed on the insulating resin layer 61 of a terminal lead plate 60a (which constitutes the semiconductor device 210) is present only in a central portion between the inner lead portion 13 and a pad on the terminal lead plate 60a. Such a construction makes it possible to perform the wire bonding method freely for various purposes.

Figure 11:
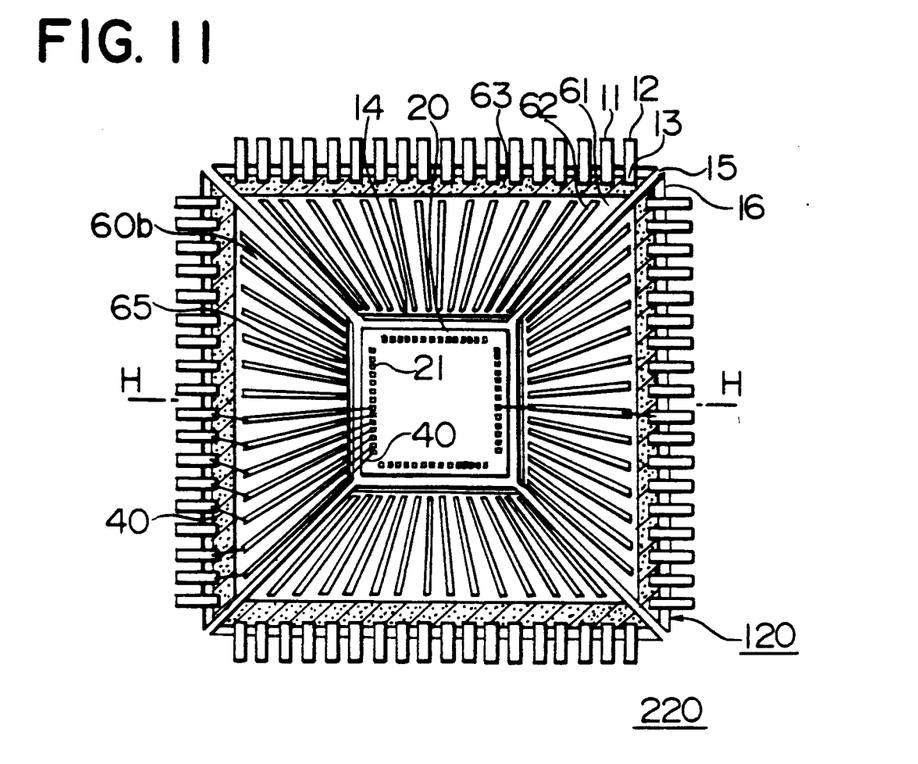
FIG. 11 is a plan view illustrating the inner structure of a semiconductor device in accordance with an embodiment of the invention.
Figure 12:
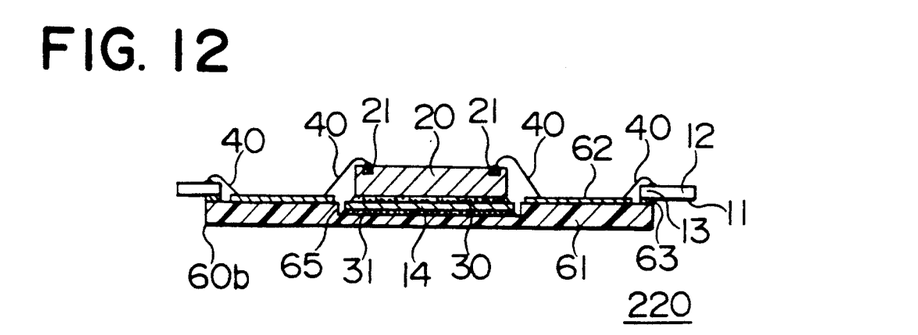
FIG. 12 is a cross-sectional view taken along line H—H of FIG. 11.

In the semiconductor device 200 of FIG. 1, an opening 64, which penetrates in a thickness direction of the terminal lead plate 60, is formed at the center of the terminal lead plate 60 in order to press the die pad downward. A recess may be formed at the center of the terminal lead plate 60 to press the die pad downward. FIG. 11 is a plan view illustrating the inner structure of a semiconductor device in accordance with another embodiment of the invention. FIG. 12 is a cross-sectional view, with a resin-molding portion omitted, taken along line H—H of FIG. 11. In a semiconductor device 220 shown in these drawings, a recess 65 is formed at the center of a terminal lead plate 60b of a lead frame of the semiconductor device 220. The die pad 14 is pressed downward, thereby being fitted into the recess 65. It is then bonded to the recess 65 with, for example, an adhesive 13.

Figure 17:
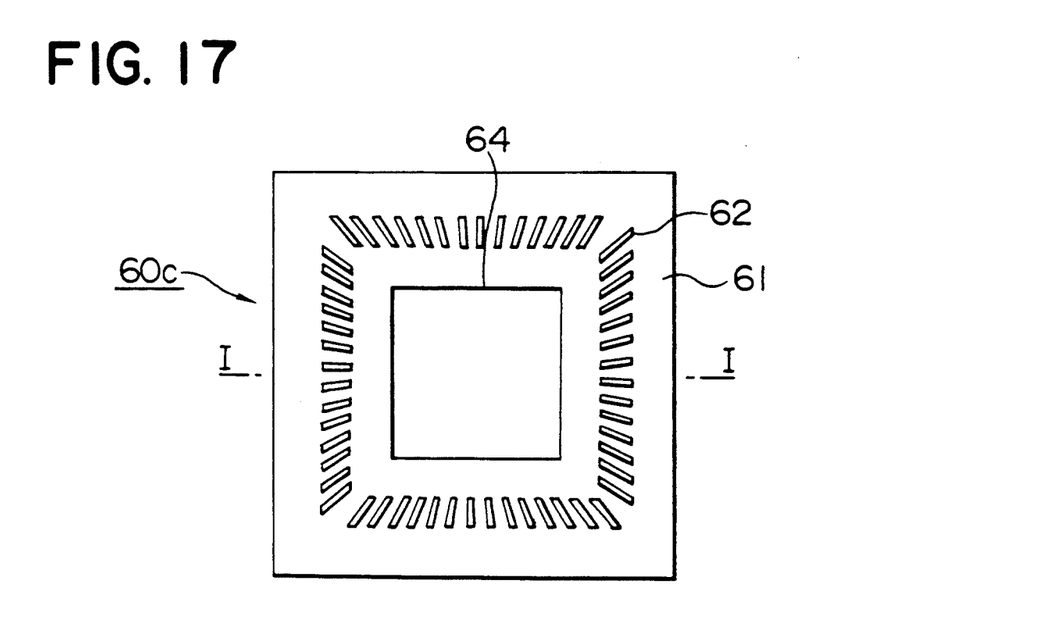
FIG. 17 is a plan view showing an embodiment of a terminal lead plate which constitutes a lead frame in accordance with an embodiment of the invention.
Figure 18:
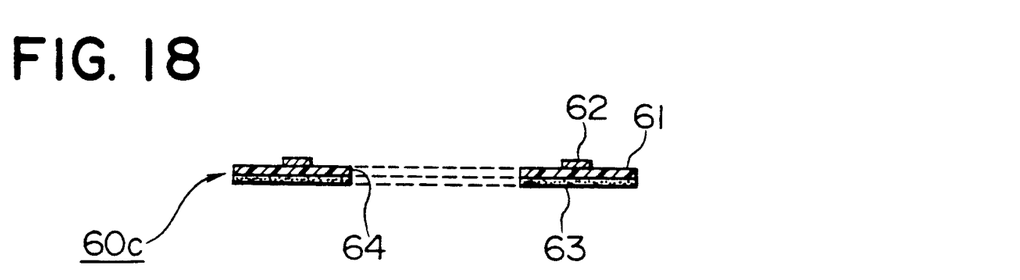
FIG. 18 is a cross-sectional view taken along line I—I, of FIG. 17.

FIG. 17 is a plan view showing a terminal lead plate 60c used for a lead frame in accordance with an embodiment of the invention. FIG. 18 is a cross-sectional view, with a resin-molding portion omitted, taken along line I—I of FIG. 17. The thermosetting adhesive layer 63 is formed on a reverse surface of the insulating resin layer 61, which differs from the embodiments of the first and third embodiments. The hole 64 or penetrating hole is formed at the center of the insulating resin layer 61. A method of forming the terminal leads 62 and the like is the same as that described with respect to the terminal lead plate in accordance with the first invention. The surfaces of the formed terminal leads 62 are plated with silver (Ag), gold (Au), copper (Cu), etc.

Figure 19:
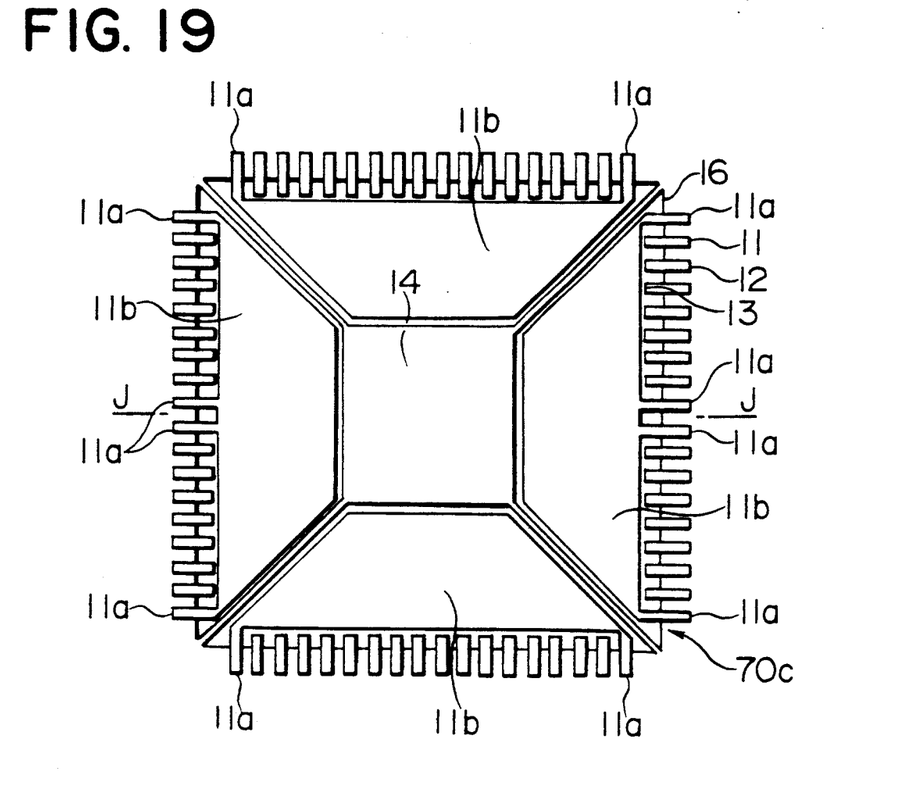
FIG. 19 is a plan view showing an embodiment of a main lead frame which constitutes a lead frame in accordance with an embodiment of the invention.
Figure 20:
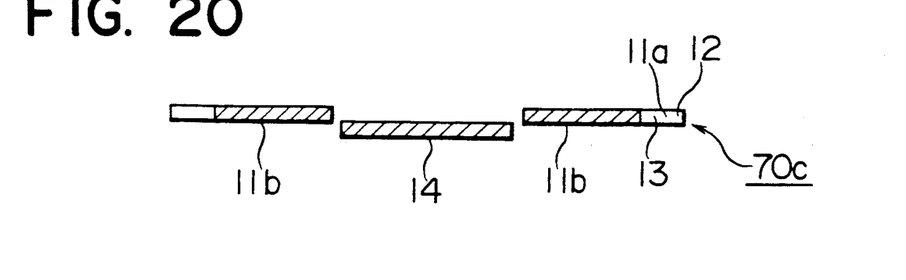
FIG. 20 is a cross-sectional view taken along line J—J of FIG. 19.

FIG. 19 is a plan view showing a main lead frame 70c used for a lead frame in accordance with another embodiment of the second invention. FIG. 20 is a cross-sectional view taken along line J—J of FIG. 19. The main lead frame 70c differs from those in the embodiments of the first and third inventions in the following way. Ground leads 11a extend from inner lead portions 13 to the die pad 14 so as to have wider areas as these ground leads 11 approach the die pad 14. As shown in FIG. 19, four trapezoidal ground pads 11b are thus formed. In this embodiment, to form such ground pads 11b, it is desirable that copper alloy be used as a material for the main lead frame 70c of the second embodiment because of its strength. Also, it is desirable that the ground leads 11a be positioned on both sides of each edge, at the center of each edge, or both sides and at the center of each edge of the lead frame. Obverse surfaces of the inner lead portions 13 of the respective leads 11, the die pad 14, and of the ground pads 11b, all of which constitute the main lead frame 70c, are also plated with silver (Ag), gold (Au), copper (Cu), and so on.

Figure 15:
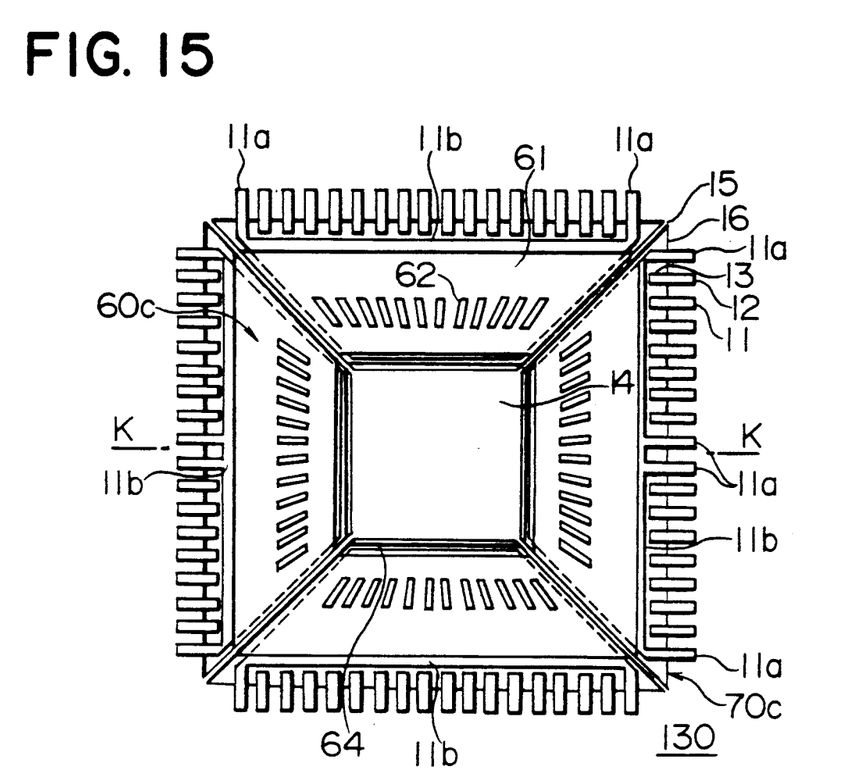
FIG. 15 is a plan view showing a lead frame in accordance with an embodiment of the invention which constitutes a terminal lead plate in FIG. 17 and a main lead frame in FIG. 19.
Figure 16:
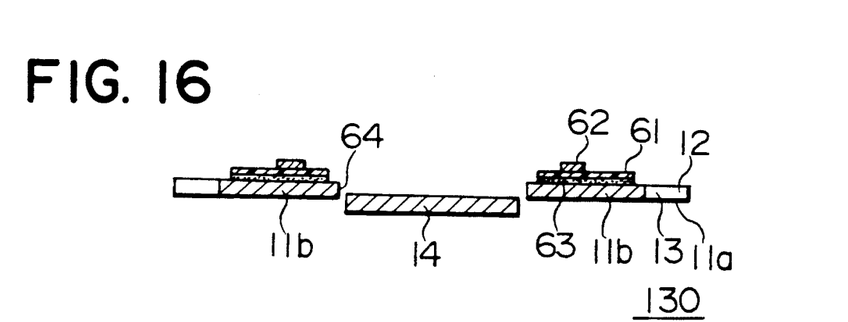
FIG. 16 is a cross-sectional view taken along line K—K of FIG. 15.

FIG. 15 is a plan view showing a lead frame 130 in accordance with an embodiment of the invention in which the terminal lead plate 60c in FIG. 17 and the main lead frame 70c in FIG. 19 are joined together. FIG. 16 is a cross-sectional view taken along line K—K of FIG. 15. The lead frame 130 is formed by pressing the terminal lead plate 60c against the four ground pads 11b of the main lead frame 70c, whereby the adhesive layer 63 is thermoset to bond together the terminal lead plate 60c and the ground pads 11b.

Figure 13:
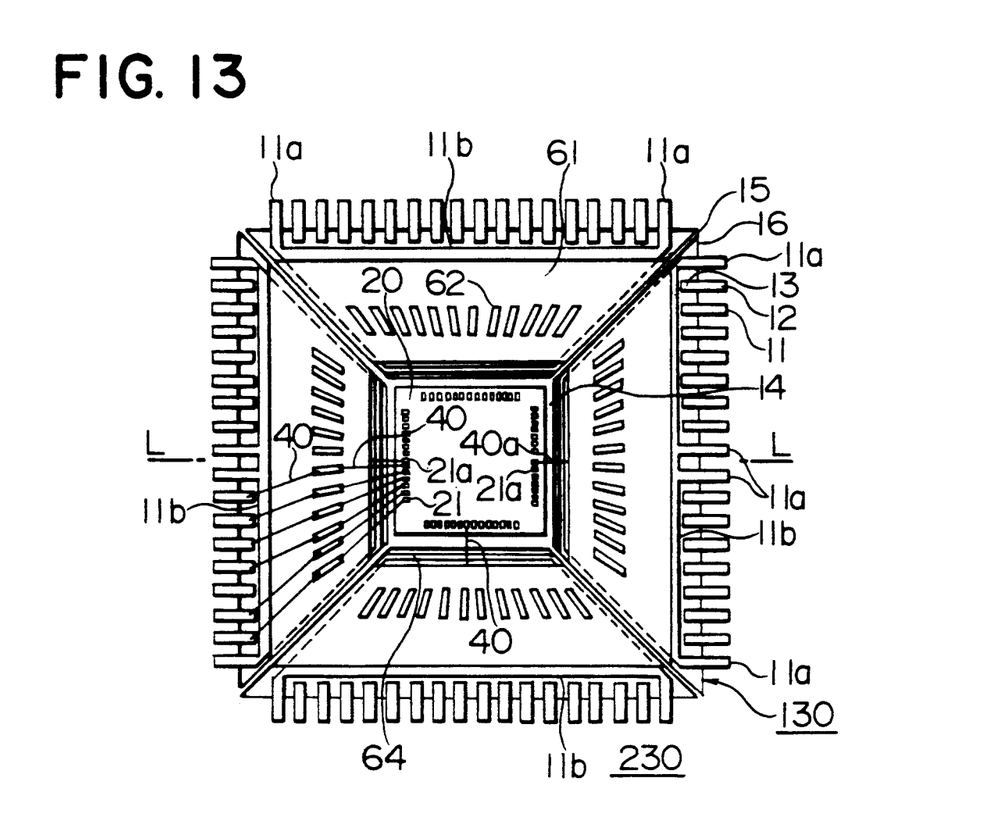
FIG. 13 is a plan view illustrating the inner structure of a semiconductor device in accordance with an embodiment of the invention.
Figure 14:
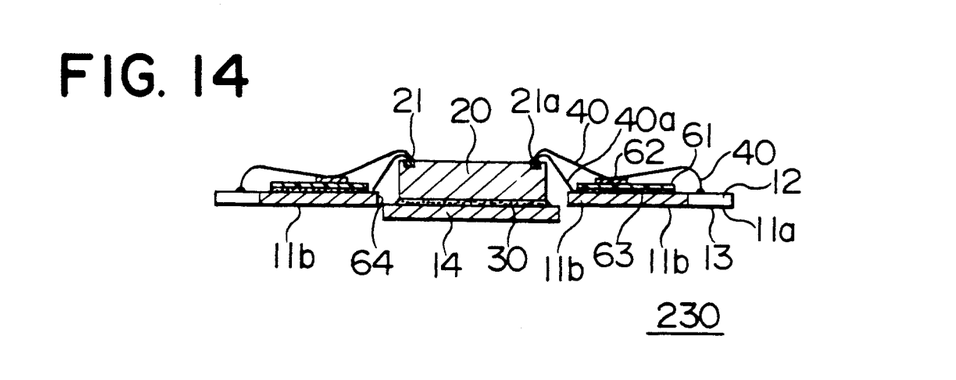
FIG. 14 is a cross-sectional view taken along line L—L of FIG. 13.

FIG. 13 is a plan view illustrating the inner structure of a semiconductor device 230, in accordance with an embodiment of the invention, which employs the lead frame 130 shown in FIGS. 15 and 16 FIG. 14 is a cross-sectional view taken along line L—L of FIG. 13. First, the semiconductor chip 20 is mounted on the die pad 14 with the die bonding material 30. Next, the wire bonding is conducted by using the Au wires 40 so as to connect the respective electrode pads 21 on the semiconductor chip 20 to the inner ends of the respective terminal leads 62, and also to connect the inner lead portions 13 of the respective leads 11 to the outer ends of the respective terminal leads 62. Ground electrodes 21a of the electrode pads 21 on the semiconductor chip 20 are connected with Au wires 40a to the ground pads 11b. The same wire bonding method is employed as that described with respect to other embodiments of the invention. Resin molding (a resin-molding portion not shown), separating the tie bars 16 from the frame, cutting the tie bars 16, and a lead process for the outer lead portions 12, all of which are performed after the wire bonding method has been completed, are carried out in the same steps and method described for the semiconductor device in accordance with the other embodiments.

A fine metal wire used for the wire bonding method in the respective embodiments mentioned above is not limited to a wire made of Au, but a wire made of Cu, Ag, Al, or Fe may also be used as a fine metal wire.

As has been described above, in accordance with the first embodiment, a portion of each lead near the die pad is composed of patterned copper foils mounted on an insulating resin. Therefore, current process technology used for lead frames can be employed to obtain a lead frame having an increased number of leads or pins.

In accordance with the second embodiments, since the inner lead portions of the ground leads extend toward the die pad in the form of ground pads having wide areas, heat generated by the semiconductor chip or the like can be efficiently dissipated. Also, since the width of each lead is widened, the inductance of each lead is decreased. A lead frame can thus be obtained which has improved frequency characteristic and reduced delay in transmitting signals.

Furthermore, in accordance with the third and fourth embodiments, because of the application of the lead frames according to the above first and second inventions, a high-powered, low-inductance semiconductor device having more pins can be obtained by the current manufacturing apparatus and method.

What is claimed is:

1. A semiconductor device mounting structure comprising:
    a unitary main lead frame having a reverse structure and an obverse structure and including a peripheral frame, a die pad disposed within said peripheral frame, suspending leads supporting said die pad and extending from said peripheral frame, and a plurality of connecting leads, each connecting lead having an inner end and an outer end, said connecting leads being arranged around and spaced from said die pad at said peripheral frame; and
    a terminal lead plate including an electrically insulating resin layer having a reverse surface and an obverse surface, a central opening receiving said die pad, a plurality of metal terminal leads disposed on the obverse surface of said electrically insulating resin layer, each terminal lead having an inner end and an outer end, each of said terminal leads extending radially relative to said die pad toward the inner end of a corresponding connecting lead wherein at least part of the reverse surface of said main lead frame is in contact with at least part of the obverse surface of said electrically insulating resin layer.

2. The semiconductor device mounting structure as claimed in claim 1 wherein the opening in said terminal lead plate is a through hole extending through said resin layer and said die pad is disposed in the through hole.

3. The semiconductor device mounting structure as claimed in claim 1 wherein the opening in said terminal lead plate is a recess in said resin layer and said die pad is disposed in the recess.

4. The semiconductor device mounting structure as claimed in claim 1 wherein said terminal lead plate is secured with an adhesive to said connecting leads.

5. The semiconductor device mounting structure as claimed in claim 1 wherein each of the terminal leads extends substantially from the opening to the inner end of the corresponding connecting lead.

6. The semiconductor device mounting structure as claimed in claim 1 wherein each of said terminal leads extends along only a central portion of a length between the opening and the inner end of the corresponding connecting lead.

7. A semiconductor device mounting structure comprising:
    a unitary main lead frame having a reverse surface and an obverse surface and including a peripheral frame, a die pad disposed within said peripheral frame, suspending leads supporting said die pad and extending from said peripheral frame, a plurality of connecting leads including at least one ground lead, each connecting lead having an inner end and an outer end, said connecting leads being arranged around and spaced from said die pad at said peripheral frame, and an electrically conducting ground plane extending from said frame toward said die pad and electrically connected to said at least one ground lead; and
    a terminal lead plate including an electrically insulating resin layer having a reverse surface and an obverse surface, a central opening receiving said die pad, a plurality of metal terminal leads disposed on the obverse surface of said electrically insulating resin layer, each of said terminal leads extending radially relative to said die pad toward the inner end of a corresponding connecting lead wherein at least part of the reverse surface of said lead frame is in contact with at least part of the obverse surface of said electrically insulating resin layer, said terminal lead plate bonded to said ground plane.

8. The semiconductor device mounting structure as claimed in claim 7 wherein the opening in said terminal lead plate is a through hole extending through said resin layer and said die pad is disposed in the through hole.

9. The semiconductor device mounting structure as claimed in claim 7 wherein the opening in said terminal lead plate is a recess in said resin layer and said die pad is disposed in the recess.

10. The semiconductor device mounting structure as claimed in claim 7 wherein said main lead frame is copper alloy.

11. The semiconductor device mounting structure as claimed in claim 7 wherein said terminal lead plate is bonded to said ground plane with an adhesive.

12. The semiconductor device mounting structure as claimed in claim 7 wherein each of the terminal leads extends substantially from the opening to the inner end of the corresponding connecting lead.

13. The semiconductor device mounting structure as claimed in claim 7 wherein each of said terminal leads extends along only a central portion of a length between the opening and the inner end of the corresponding connecting lead.

14. A semiconductor device comprising:
   a unitary main lead frame having a reverse surface and an obverse surface and including a peripheral frame, a die pad disposed within said peripheral frame, suspending leads supporting said die pad and extending from said peripheral frame, and a plurality of connecting leads, each connecting lead having an inner end and an outer end, said connecting leads being arranged around and spaced from said die pad at said peripheral frame;
   a terminal lead plate including an electrically insulating resin layer having a reverse surface and an obverse surface, a central opening receiving said die pad, a plurality of metal terminal leads disposed on the obverse surface of electrically insulating resin layer, each terminal lead having an inner end and an outer end, each of said terminal leads extending radially relative to said die pad toward the inner end of a corresponding connecting lead wherein at least part of the reverse surface of said main lead frame is in contact with at least part of the obverse surface of said electrically insulating resin layer;
   a semiconductor chip having an obverse surface with a plurality of electrode pads and a reverse surface, the reverse surface of said semiconductor chip being bonded to the obverse surface of said die pad;
   a plurality of wires, respective wires electrically connecting respective electrode pads to the inner ends of corresponding terminal leads and the outer ends of respective terminal leads to the inner ends of corresponding connecting leads; and
   a resin encapsulating the chip and die pad with the outer ends of said connecting leads protruding from said resin.

15. A semiconductor device comprising:
   a unitary main lead frame having a reverse surface and an obverse surface and including a peripheral frame, a die pad disposed within the peripheral frame, suspending leads supporting said die pad and extending from said peripheral frame, a plurality of connecting leads including at least one ground lead, each connecting lead having an inner end and an outer end, said connecting leads being arranged around and spaced from said die pad at said peripheral frame, and an electrically conducting ground plane extending from said frame toward said die pad and electrically connecting to said at least one ground lead;
   a terminal lead plate including an electrically insulating resin layer having a reverse surface and an obverse surface, a central opening receiving said die pad, a plurality of metal terminal leads disposed on the obverse surface of said electrically insulating resin layer, each of said terminal leads extending radially relative to said die pad toward the inner end of a corresponding connecting lead wherein at least part of the reverse surface of said lead frame is in contact with at least part of the obverse surface of said electrically insulating resin layer, said terminal lead plate being bonded to said ground plane;
   a semiconductor chip having an obverse surface with a plurality of electrode pads including at least one ground electrode and a reverse surface, the reverse surface of said semiconductor chip being bonded to the obverse surface of said die pad;
   a plurality of wires, respective wires electrically connecting respective electrode pads to the inner ends of corresponding terminal leads, said ground electrode to said ground plane, and the outer ends of respective terminal leads to the inner ends of corresponding connecting leads; and
   a resin encapsulating the chip and die pad with the outer ends of said connecting leads protruding from said resin.

* * * * *

UNITED STATES PATENT AND TRADEMARK OFFICE
CERTIFICATE OF CORRECTION

PATENT NO. : 5,293,066
DATED : March 8, 1994
INVENTOR(S) : Kiyoaki Tsumura

It is certified that error appears in the above-indentified patent and that said Letters Patent is hereby corrected as shown below:

Col. 7, line 46, change "structure" to --surface--.
Col. 8, line 46, after "plate" insert --being--.
Col. 10, line 10, change "connecting" to --connected--.

Signed and Sealed this

Sixteenth Day of August, 1994

Attest:

BRUCE LEHMAN

*Attesting Officer*   *Commissioner of Patents and Trademarks*